United States Patent
Waldron et al.

(10) Patent No.: US 6,476,497 B1
(45) Date of Patent: Nov. 5, 2002

(54) CONCENTRIC METAL DENSITY POWER ROUTING

(75) Inventors: Robert D. Waldron, Fort Collins, CO (US); Rich Schultz, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 79 days.

(21) Appl. No.: 09/817,642

(22) Filed: Mar. 26, 2001

(51) Int. Cl.[7] .......................... H01L 21/82; H01L 21/44; H01L 21/4763; H01L 23/52; H01L 29/40
(52) U.S. Cl. ....................... 257/775; 438/129; 438/597; 438/598; 438/637; 257/691; 257/692; 257/773
(58) Field of Search ..................... 438/129, 597–599, 438/618, 637–640; 257/690–697, 700, 621, 773–775

(56) References Cited

U.S. PATENT DOCUMENTS 5,119,169 A * 6/1992 Kozono et al.
5,824,570 A * 10/1998 Aoki et al.
6,111,269 A * 8/2000 Moyal
6,306,745 B1 * 10/2001 Chen

* cited by examiner

*Primary Examiner*—Ha Tran Nguyen
(74) *Attorney, Agent, or Firm*—Fitch, Even, Tabin & Flannery

(57) ABSTRACT

A method for concentric metal density power distribution is disclosed that reduces metal density and increases available area for routing clock and signal traces. A method of concentric metal density power distribution includes the steps of partitioning an area of standard cells in an integrated circuit chip into a plurality of power regions, forming a power boundary around each of the plurality of power regions, and forming a plurality of concentric straps in a metal layer of the integrated circuit chip wherein each of the plurality of concentric straps has a strap width that varies from a maximum strap width at a periphery of each of the plurality of power regions to a minimum strap width toward a center of each of the plurality of power regions.

10 Claims, 6 Drawing Sheets

CONCENTRIC METAL DENSITY POWER ROUTING

BACKGROUND OF THE INVENTION

The present invention relates generally to power distribution in integrated circuits. More specifically, but without limitation thereto, the present invention relates to reducing the amount of metal in integrated circuits having circuit components connected to power buses by metal grids or straps.

In a conventional method for distributing power in integrated circuit chips, power and ground traces are typically routed orthogonally to concentric power and ground straps formed in metal layers of the chip. The power and ground traces use a substantial fraction of the area of the metal layer to maintain IR drops (voltage drops due to peak current flowing through the bus resistance) within a few percent of the voltage rail. The remaining area of the metal layer between the straps is left for wiring tracks for global signals such as the clock signal. A disadvantage of the conventional method is that the amount of metal used in the concentric straps results in signal routing congestion, especially toward the center of the chip where the density of signal traces is typically the highest.

SUMMARY OF THE INVENTION

The present invention advantageously addresses the problems above as well as other problems by providing a method for concentric metal density power distribution that reduces metal density and increases available area for routing clock and signal traces.

In one embodiment, the invention may be characterized as a method for concentric metal density power distribution that includes the steps of forming a plurality of concentric straps in a metal layer of an integrated circuit chip and varying a strap width of each of the plurality of concentric straps from a maximum strap width at a periphery of the integrated circuit chip to a minimum strap width toward a center of the integrated circuit chip.

In another embodiment, the invention may be characterized as a method of concentric metal density power distribution that includes the steps of partitioning an area of standard cells in an integrated circuit chip into a plurality of power regions, forming a power boundary around each of the plurality of power regions, and forming a plurality of concentric straps in a metal layer of the integrated circuit chip wherein each of the plurality of concentric straps has a strap width that varies from a maximum strap width at a periphery of each of the plurality of power regions to a minimum strap width toward a center of each of the plurality of power regions.

The features and advantages summarized above in addition to other aspects of the present invention will become more apparent from the description, presented in conjunction with the following drawings.

BRIEF DESCRIPTION OF THE DRAWINGS

The above and other aspects, features and advantages of the present invention will be more apparent from the following more specific description thereof, presented in conjunction with the following drawings wherein.

Corresponding reference characters indicate corresponding elements throughout the several views of the drawings.

DETAILED DESCRIPTION OF THE DRAWINGS

The following description is presented to disclose the currently known best mode for making and using the present invention. The scope of the invention is defined by the claims.

An important step of integrated circuit design is the layout of a power distribution network to connect each cell of the integrated circuit to power and ground. The power distribution network includes a grid of power rings or straps formed in certain metal layers of the integrated circuit chip. Automated design tools for integrated circuits available from, for example, Avant!, Cadence, and Mentor Graphics, include a power router that generates a power distribution network in the metal layers of each integrated circuit design. Currently, these power routers use a constant strap width. An improved power routing tool that may be adapted to these automated design tools advantageously exploits the fact that total power required of an integrated circuit typically decreases toward the center of the chip, while the number of signal traces in the center of the chip is typically higher than at the periphery of the chip.

Figure 1:
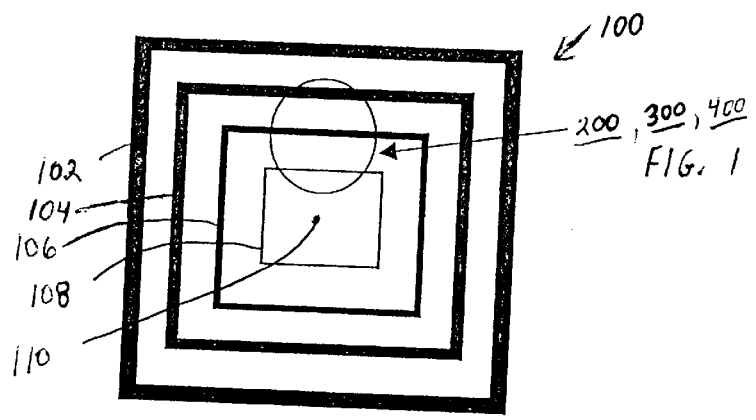
FIG. 1 is a diagram of a power distribution network for an integrated circuit chip illustrating concentrically varied strap width according to an embodiment of the present invention.

FIG. 1 is a diagram of a power distribution network for an integrated circuit chip illustrating concentrically varied strap width. Shown in FIG. 1 are an outer power ring 102, intermediate power rings 104 and 106, an inner power ring 108, and a center 110.

The outer power ring 102, the intermediate power rings 104 and 106, and the inner power ring 108 are rectangular in shape and share the common center 110. The outer power ring 102 has a maximum strap width, while the strap width of the intermediate power rings 104 and 106 decreases toward the center of the integrated circuit chip.

The strap width of a conventional integrated circuit is a constant determined by the total power requirements of the chip. In the extreme, the strap becomes a power plane, i.e., a sheet of metal. In contrast to the constant strap width of a conventional integrated circuit, the inner power ring 108 has a minimum strap width of, for example, 30 microns, because the power required near the center 110 of the integrated circuit chip is less than that required at greater distances from the center where the higher-current input/output (I/O) functions are located. The intermediate power ring 106 adjacent to and concentric with the inner power ring 108 has a strap width greater than that of the inner power ring 108, for example, 60 microns. The intermediate power ring 104 adjacent to and concentric with the intermediate power ring 106 has a strap width greater than that of the intermediate power ring 106, for example 120 microns. The outer power ring 102 adjacent to and concentric with the intermediate power ring 104 has a strap width greater than that of the intermediate power ring 104, for example, 240 microns, to accommodate the peak current load at the periphery of the integrated circuit chip.

Figure 2:
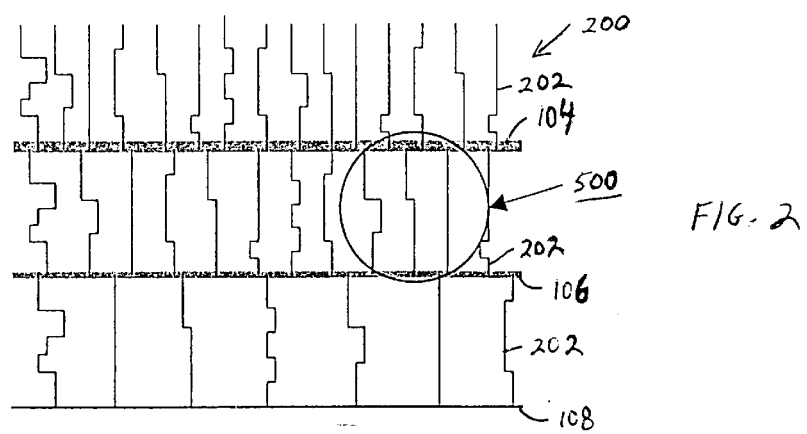
FIG. 2 is an enlarged view of a portion of FIG. 1 illustrating power traces routed orthogonally to the concentric straps in the M2 metal layer.

FIG. 2 is an enlarged view of a portion 200 of FIG. 1 illustrating power traces in the M2 metal layer routed orthogonally (shown in FIG. 2 as the vertical direction) to the concentric straps in the M3 layer. By convention, odd-numbered metal layers are used for routing horizontal traces, and even-numbered metal layers are used for routing vertical traces. Shown in FIG. 2 are the inner power ring 108, the intermediate power rings 104 and 106, and M2 layer power traces 202.

The M2 layer power traces 202 are routed orthogonally to the power rings 104, 106, and 108 to connect to VDD and VSS voltages. Because the M2 layer is typically used for routing signal traces within standard cells, the M2 layer power traces 202 are diverted by the power router to avoid M2 layer routes within the standard cells, shown in FIG. 2 as horizontal sections in the M2 layer power traces 202.

Figure 3:
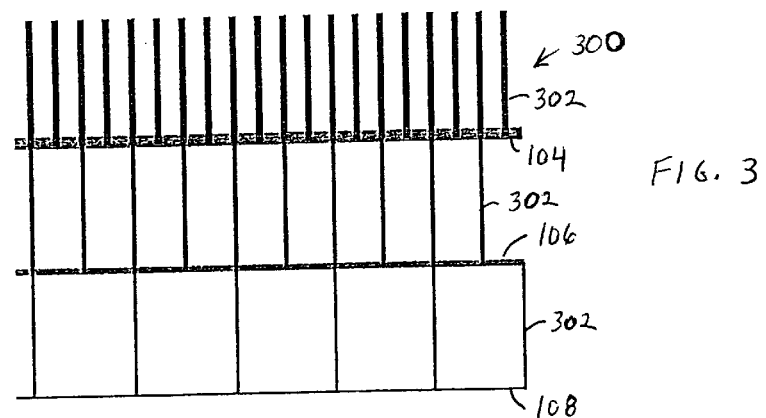
FIG. 3 is an enlarged view of a portion of FIG. 1 illustrating power traces routed orthogonally to the concentric straps in the M4 metal layer.

FIG. 3 is an enlarged view of a portion 300 of FIG. 1 illustrating power traces routed orthogonally to the concentric straps in the M4 metal layer. Shown in FIG. 3 are inner power ring 108, intermediate power rings 106 and 104, and M4 layer power traces 302.

The M4 layer power traces 302 are routed orthogonally to the power rings to connect standard cells to VDD and VSS voltages. Because the M4 layer is not used for routing signal traces within standard cells, the M4 layer power traces 302 may be routed in straight lines.

Figure 4:
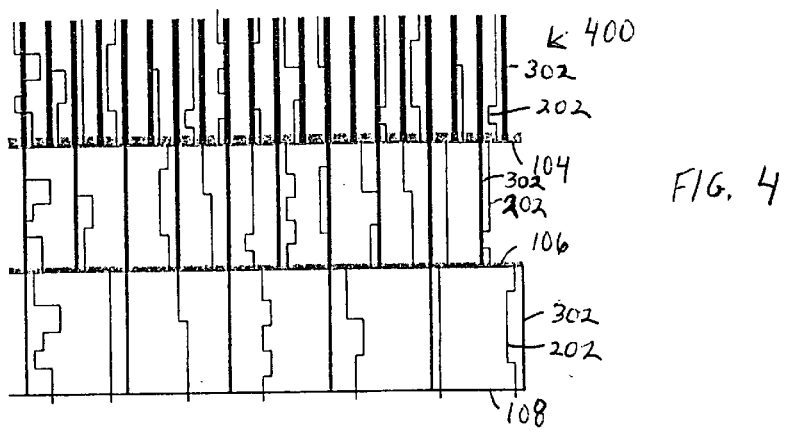
FIG. 4 is an enlarged view of a portion of FIG. 1 illustrating power traces routed orthogonally to the concentric straps in both the M2 and the M4 metal layers.

FIG. 4 is an enlarged view of a portion 400 of FIG. 1 illustrating power traces in both the M2 and the M4 metal layers routed orthogonally to the concentric straps. Shown in FIG. 4 are the inner power ring 108, the intermediate power rings 106 and 104, M2 layer power traces 202, and M4 layer power traces 302. This arrangement accommodates integrated circuit designs having higher peak current requirements than may be accommodated using only one of the M2 and M4 metal layers for routing power traces 202 and 302.

Figure 5:
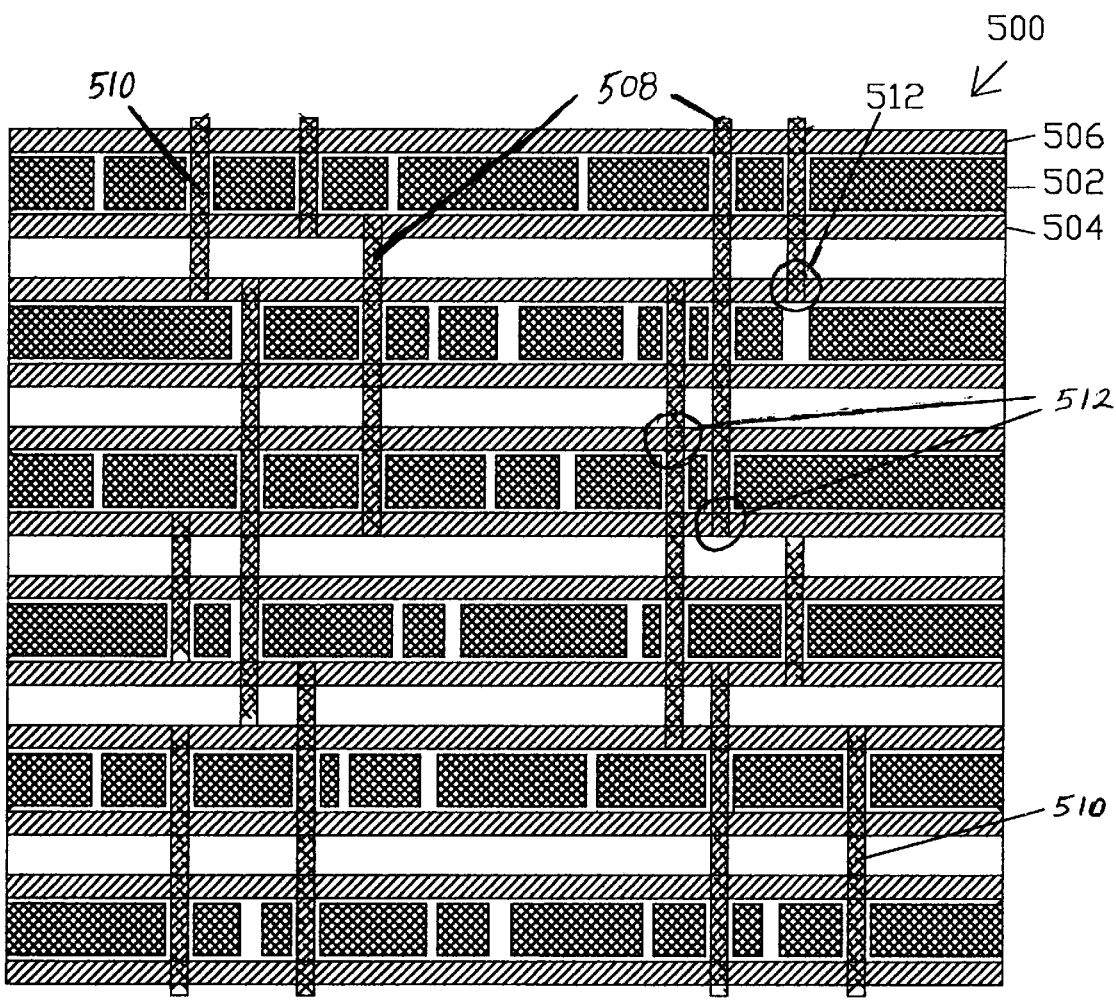
FIG. 5 is a further enlarged view of a portion of FIG. 2 illustrating power traces routed orthogonally to the concentric straps in the M2 metal layer to distribute power and ground to standard cells between VSS and VDD rails.

FIG. 5 is a further enlarged view of a portion 500 of FIG. 2 illustrating power traces routed orthogonally to the concentric straps in the M2 metal layer to distribute power and ground to standard cells between VSS and VDD rails. Shown in FIG. 5 are standard cells 502, M1 layer VSS power straps 504, M1 layer VDD power straps 506, M2 layer VSS power straps 508, M2 layer VDD power straps 510, and vias 512. The vias 512 connect the M2 layer power straps 508 and 510 to the M1 layer power straps 504 and 506, respectively.

The standard cells 502 may be placed using an automatic cell placement algorithm or manually. The standard cells 502 are typically aligned top to bottom during cell placement to reduce the interconnect length between them. The white space surrounding the standard cells 502 represents unused cell space.

The M2 layer VSS power straps 508 and the M2 layer VDD power straps 510 are connected respectively to the M1 layer VSS power straps 504 and the M1 layer VDD power straps 506 by the vias 512. The vias 512 are formed at the intersections of the M2 layer power straps 508 and 510 and the M1 layer power straps 504 and 506. A power router, typically included with the automated design tools mentioned above, determines how many power traces are needed to divide up the required amount of metal. For example, signal integrity (SI) tables that provide guidelines for strap width relative to power requirements may require 30 micron power traces every 200 microns. The power router may implement this requirement with a single 30 micron power trace, two 15 micron straps, three 10 micron power traces, and so on.

Figure 6:
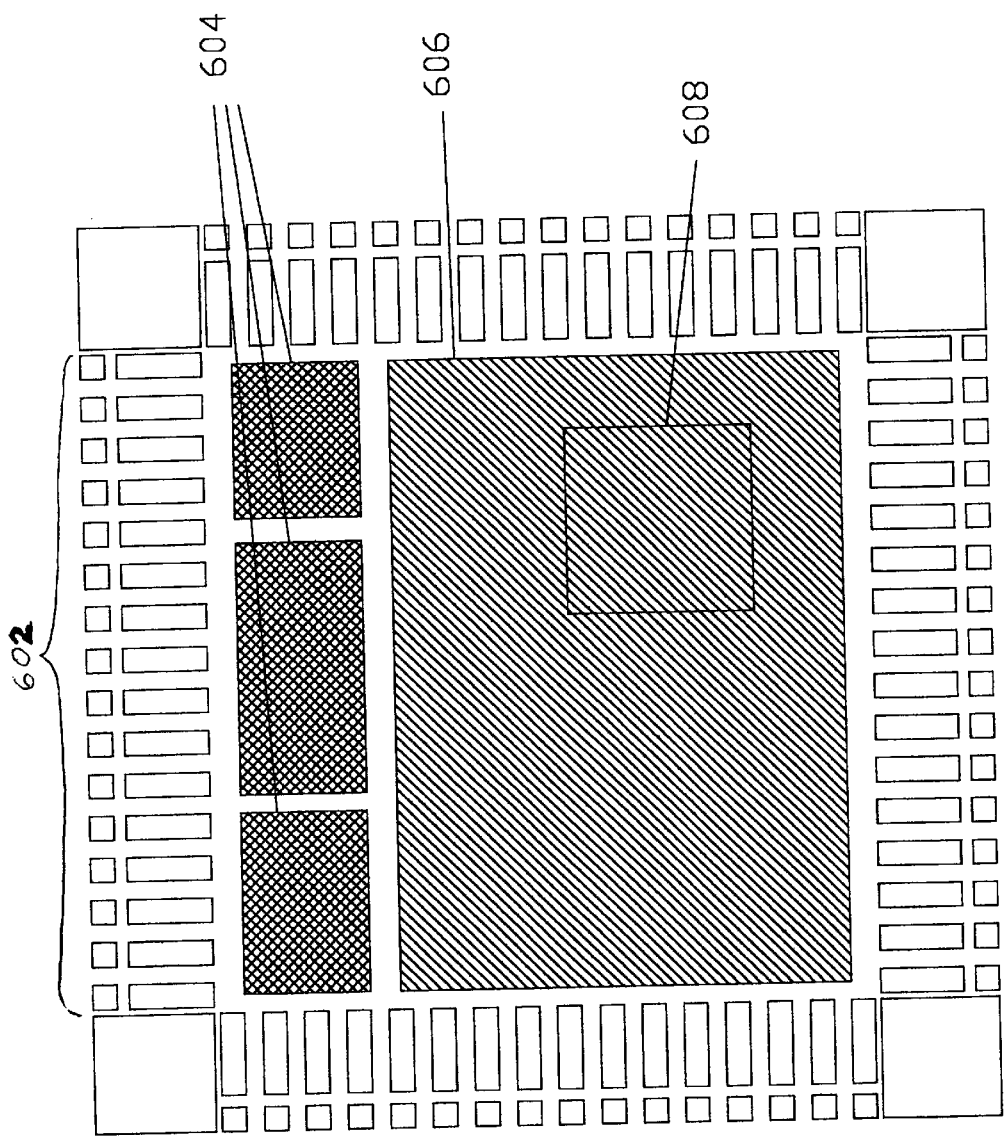
FIG. 6 is a diagram of an integrated circuit illustrating a method for concentric metal density power distribution according to another embodiment of the present invention.

FIG. 6 is a diagram of an integrated circuit illustrating a method for concentric metal density power distribution. Shown in FIG. 6 are bonding pads and input/output circuits 602, macros 604, an area of standard cells 606, and a power routing region 608. The macros 604 are predefined groups of cells that already include power routing. The area of standard cells 606 is laid out by a floorplanning tool, and power distribution is laid out by the power router within the power routing region selected by the circuit designer. The power routing region 608 may be a part of the area of standard cells 606 as shown in FIG. 6, the entire area of standard cells 606, or multiple areas within the area of standard cells 606.

Figure 7:
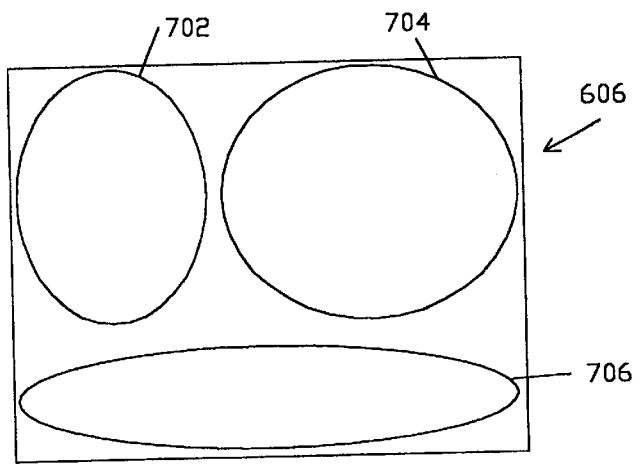
FIG. 7 is a diagram of the standard cell area of the integrated circuit of FIG. 6 illustrating power region partitioning.

FIG. 7 is a diagram of the standard cell area of the integrated circuit of FIG. 6 illustrating power region partitioning. Shown in FIG. 7 are the area of standard cells 606, a first power region 702, a second power region 704, and a third power region 706.

In this example, the area of standard cells 606 is divided into three power regions determined by the netlist hierarchy and by the placement of standard cells within the chip by the floorplanning tool, which accounts for both peak and average current. Once the standard cells are in place, they may be identified either by the Group and Region used in FloorPlanning or by pattern match. The peak power requirement of a power region is determined by gate count, clock frequency, and switching factor. In this example, the first power region 702 is estimated to require a peak power of three watts, the second power region 704 is estimated to require a peak power of one watt, and the third power region 706 is estimated to require a peak power of 0.5 watt. The circuit designer then defines a power region boundary around the highest power consuming region, the first power region 702.

Figure 8:
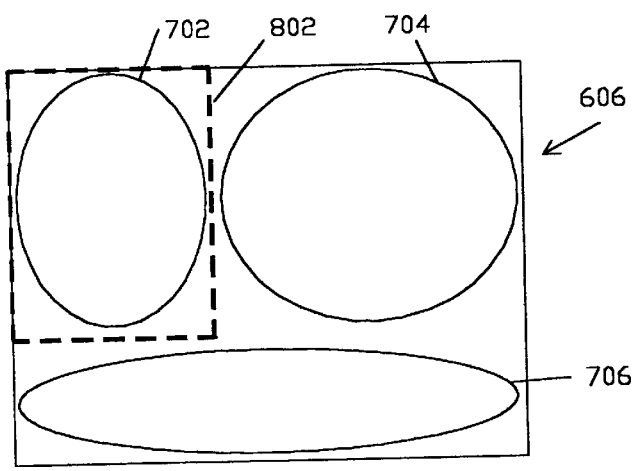
FIG. 8 is a diagram of the power region partitioning of FIG. 7 illustrating a power region boundary.

FIG. 8 is a diagram of the power region partitioning of FIG. 7 illustrating a power region boundary. Shown in FIG. 8 are the area of standard cells 606, the first power region 702, the second power region 704, the third power region 706, and a first power region boundary 802. Once the power region boundary 802 has been defined, a power region boundary is defined for the next highest power consuming region, power region 704, and so on.

Figure 9:
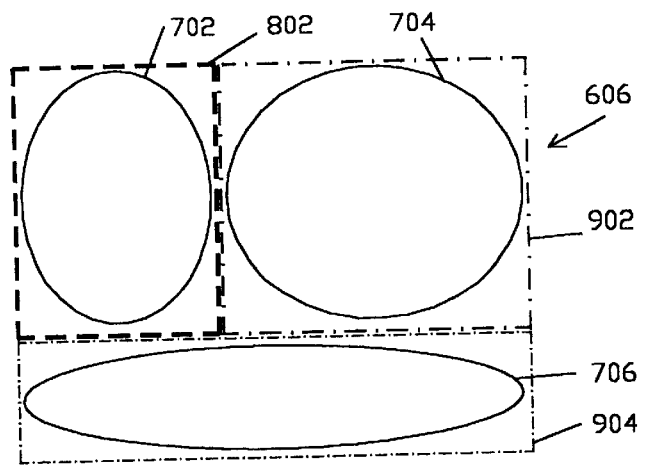
FIG. 9 is a diagram of the power region partitioning of FIG. 7 illustrating power region boundaries defined for each power region within the standard cell area.

FIG. 9 is a diagram of the power region partitioning of FIG. 7 illustrating power region boundaries defined for each power region within the standard cell area 606. Shown in FIG. 9 are the area of standard cells 606, the first power region 702, the second power region 704, the third power region 706, the first power region boundary 802, a second power region boundary 902, and a third power region boundary 904.

A name, an estimated peak power requirement, and a power region boundary description is assigned to each of the power regions 702, 704, and 706. In this example, the power region 702 has an estimated peak power requirement of three watts and the boundary description 802, the power region 704 has an estimated peak power requirement of one watt and the boundary description 902, and the power region 706 has an estimated peak power requirement of 0.5 watt and the boundary description 904. Any area within the standard cell area 606 not included within one of the defined power region boundaries 802, 902, and 904 is routed using a system default peak power requirement estimate. The power router then calculates a strap width for the outer power ring of each power region.

Figure 10:
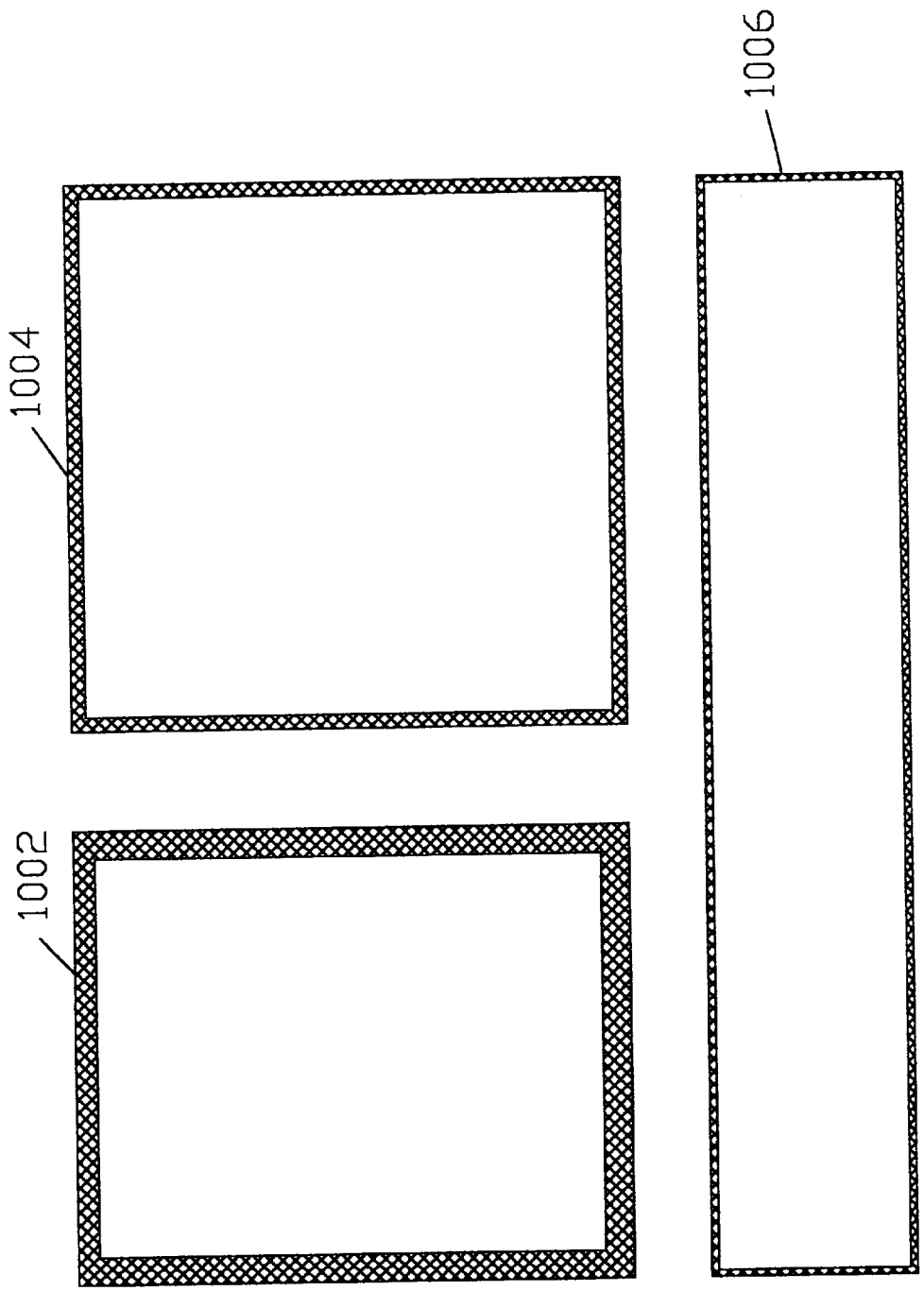
FIG. 10 is a diagram showing relative size of the outer power rings at each power region boundary of FIG. 9.

FIG. 10 is a diagram showing relative size of the outer power rings at each power region boundary of FIG. 9. Shown in FIG. 10 are an outer power ring 1002 of the first power region 702, an outer power ring 1004 of the second power region 704, and an outer power ring 1006 of the third power region 706. The strap width of each of the outer power rings 1002, 1004, and 1006 is selected to satisfy the respective peak power requirements of three watts, one watt, and 0.5 watt for the power regions 702, 704, and 706. Once the strap width for each of the outer power rings 1002, 1004, and 1006 has been determined, the strap width along the common boundary lines has to be resized by adding the strap width of the adjacent power ring to account for the increased current load at the common boundary.

Figure 11:
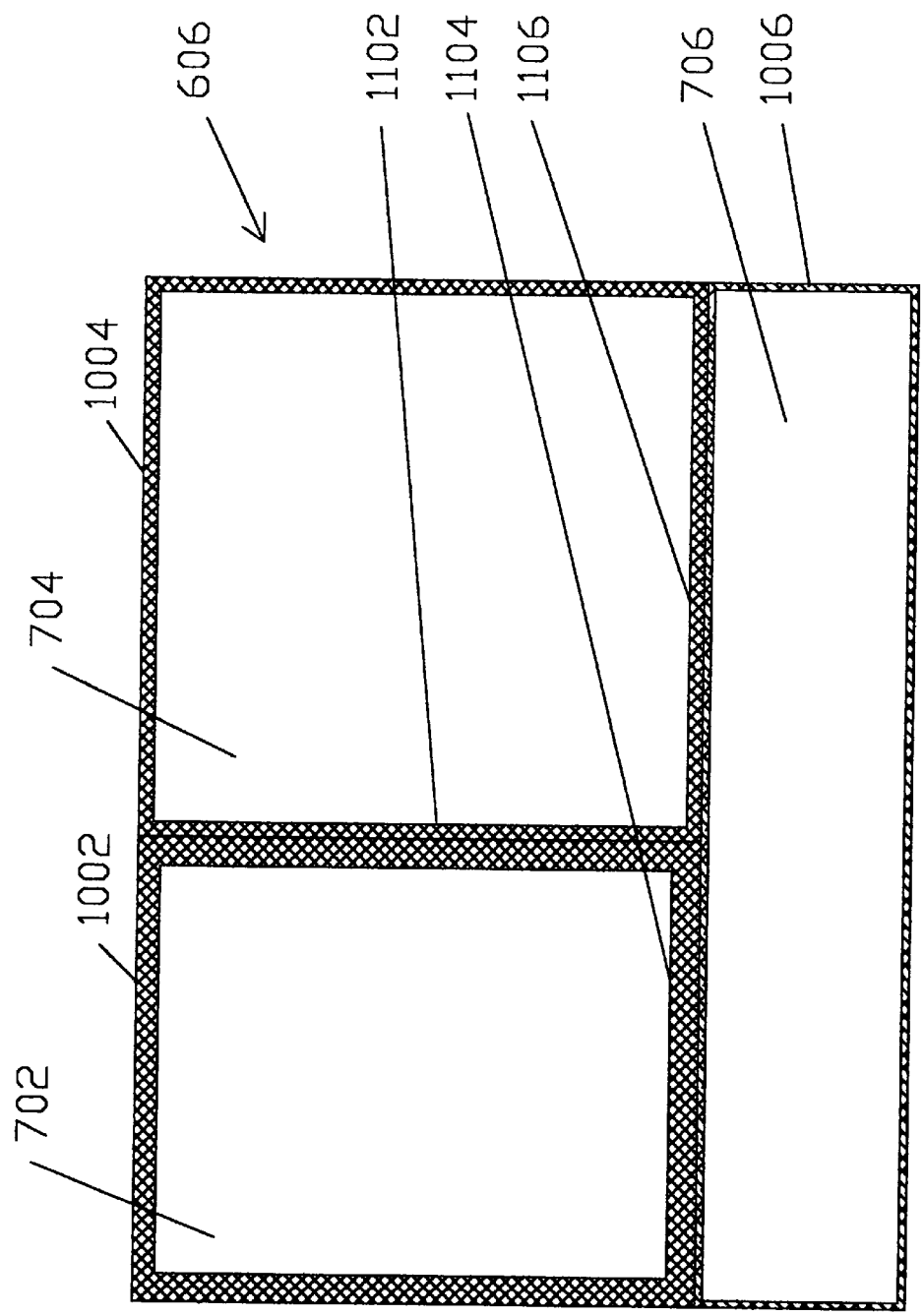
FIG. 11 is a diagram of resized outer power rings for each power region boundary of FIG. 9.

FIG. 11 is a diagram illustrating resized outer power rings for each power region boundary of FIG. 9. Shown in FIG. 11 are the area of standard cells 606, the first power region 702, the second power region 704, the third power region 706, the outer power ring 1002 of the first power region 702, the outer power ring 1004 of the second power region 704, the outer power ring 1006 of the third power region 706, and the common boundaries 1102, 1104, and 1106.

As shown in FIG. 11, the resized strap width along the common boundaries 1102, 1104, and 1106 strap width along is greater than the strap widths of the power region on either side of the common boundaries 1102, 1104, and 1106.

Once the strap widths of the outer power rings 1002, 1004, and 1006 have been determined, the power router continues the power distribution layout for each power region as shown in FIGS. 1–5 and explained above.

By decreasing the strap width concentrically from the outer power ring to the inner power ring of a power region according to the method described above, more metal area is made available for routing signal traces.

Other modifications, variations, and arrangements of the present invention may be made in accordance with the above teachings other than as specifically described to practice the invention within the spirit and scope defined by the following claims.

What is claimed is:

1. A method for concentric metal density power distribution comprises the steps of:

forming a plurality of concentric straps in a metal layer within an integrated circuit chip; and varying a strap width of the plurality of concentric straps from a maximum strap width at a periphery of the integrated circuit chip to a minimum strap width toward a center of the integrated circuit chip.

2. The method of claim 1 further comprising the step of defining a power region within a standard cell area on the integrated circuit chip.

3. The method of claim 1 further comprising the step of routing a plurality of power traces orthogonally to the plurality of concentric straps in a separate metal layer and connecting the plurality of power traces to the plurality of concentric straps by vias formed between the metal layer and the separate metal layer.

4. The method of claim 3 further comprising the step of routing a plurality of VSS and VDD power straps parallel to the concentric straps and connecting the plurality of VSS and VDD power straps to the plurality of power traces by vias.

5. A power distribution network comprising a plurality of concentric straps formed in a metal layer of an integrated circuit chip wherein each of the plurality of concentric straps has a strap width that varies from a maximum strap width at a periphery of the integrated circuit chip to a minimum strap width toward a center of the integrated circuit chip.

6. The power distribution network of claim 5 further comprising a plurality of power traces routed orthogonally to the plurality of concentric straps on a separate metal layer and connected to the plurality of concentric straps by vias formed between the metal layer and the separate metal layer.

7. The power distribution network of claim 6 further comprising a plurality of VSS and VDD power straps routed parallel to the concentric straps and connected to the plurality of power traces by vias.

8. A method for concentric metal density power distribution comprising the steps of:

(a) defining a power region within a standard cell area of an integrated circuit;

(b) defining a boundary enclosing the power region;

(c) selecting a strap width for an outer power ring at the boundary of the power region;

(d) resizing the strap width along a common boundary shared by another power region; and (e) routing a plurality of concentric straps within the power region wherein each of the plurality of concentric straps has a strap width that varies from a maximum strap width at a periphery of the power region to a minimum strap width toward a center of the power region.

9. The method of claim 8 further comprising the step of (f) routing a plurality of power traces orthogonally to the plurality of concentric straps in a separate metal layer and connecting the plurality of power traces to the plurality of concentric straps by vias formed between the metal layer and the separate metal layer.

10. The method of claim 9 further comprising the step of (g) routing a plurality of VSS and VDD power straps parallel to the concentric straps and connecting the plurality of VSS and VDD straps to the plurality of power traces by vias.

* * * * *